(12) United States Patent
Totsuka et al.

(10) Patent No.: US 7,489,757 B2
(45) Date of Patent: Feb. 10, 2009

(54) CLOCK DATA RECOVERY CIRCUIT

(75) Inventors: Hirofumi Totsuka, Tokyo (JP);
Hitoyuki Tagami, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 541 days.

(21) Appl. No.: 10/517,493

(22) PCT Filed: May 1, 2003

(86) PCT No.: PCT/JP03/05584

§ 371 (c)(1),
(2), (4) Date: Dec. 10, 2004

(87) PCT Pub. No.: WO2004/098120

PCT Pub. Date: Nov. 11, 2004

(65) Prior Publication Data

US 2005/0213696 A1    Sep. 29, 2005

(51) Int. Cl.
*H03D 3/24* (2006.01)
(52) U.S. Cl. .................. 375/376; 375/354; 375/371
(58) Field of Classification Search .......... 375/354–376
See application file for complete search history.

(56) References Cited

U.S. PATENT DOCUMENTS

| 4,464,771 | A | * | 8/1984 | Sorensen | 375/374 |
| 4,521,745 | A | * | 6/1985 | Falconer | 331/2 |
| 4,611,230 | A | * | 9/1986 | Nienaber | 348/511 |
| 4,672,597 | A | * | 6/1987 | Yamazaki | 369/47.28 |
| 5,036,298 | A | * | 7/1991 | Bulzachelli | 331/23 |
| 5,197,082 | A | * | 3/1993 | Uda et al. | 375/214 |
| 5,436,938 | A | * | 7/1995 | Pigeon | 375/376 |
| 5,471,502 | A | * | 11/1995 | Ishizeki | 375/376 |
| 5,504,751 | A | * | 4/1996 | Ledzius et al. | 341/144 |
| 5,557,648 | A | * | 9/1996 | Ishihara | 375/376 |
| 5,687,202 | A | * | 11/1997 | Eitrheim | 375/376 |
| 5,953,386 | A | * | 9/1999 | Anderson | 375/376 |
| 5,987,082 | A | * | 11/1999 | Fujimoto | 375/355 |

(Continued)

FOREIGN PATENT DOCUMENTS

CN    1198043    11/1998

(Continued)

OTHER PUBLICATIONS

Ansgar Pottbacker et al., "A Si Bipolar Phase and Frequency Detector IC for Clock Extraction up to 8GB/s", IEEE Journal of Solid State Circuits, Dec. 1992, vol. SC-27, pp. 1747-1751.

*Primary Examiner*—Chieh M Fan
*Assistant Examiner*—Jason M. Perilla
(74) *Attorney, Agent, or Firm*—Buchanan Ingersoll & Rooney PC

(57) ABSTRACT

A frequency divider generates frequency-divided input data by dividing a frequency of input data. A phase comparator detects a phase difference between a phase of a clock generated by a voltage control oscillator and a phase of the frequency-divided input data, and generates a phase difference signal to be used to eliminate the detected phase difference. The voltage control oscillator generates the clock by adjusting an oscillation frequency based on the phase difference signal. A data identifier identifies the input data using the clock generated by the voltage control oscillator.

2 Claims, 14 Drawing Sheets

U.S. PATENT DOCUMENTS

| | | | |
|---|---|---|---|
| 6,002,282 A * | 12/1999 | Alfke | 327/165 |
| 6,009,134 A * | 12/1999 | Yoon | 375/376 |
| 6,028,903 A * | 2/2000 | Drost et al. | 375/360 |
| 6,154,511 A | 11/2000 | Nakamura et al. | |
| 6,157,690 A * | 12/2000 | Yoneda | 375/376 |
| 6,236,696 B1 | 5/2001 | Aoki et al. | |
| 6,236,697 B1 * | 5/2001 | Fang | 375/376 |
| 6,259,755 B1 | 7/2001 | O'Sullivan et al. | |
| 6,320,435 B1 * | 11/2001 | Tanimoto | 327/156 |
| 6,351,165 B1 * | 2/2002 | Gregorian et al. | 327/156 |
| 6,359,950 B2 * | 3/2002 | Gossmann et al. | 375/376 |
| 6,509,776 B2 * | 1/2003 | Kobayashi et al. | 327/277 |
| 6,614,840 B1 * | 9/2003 | Maruyama | 375/232 |
| 6,630,868 B2 * | 10/2003 | Perrott et al. | 331/17 |
| 6,738,922 B1 * | 5/2004 | Warwar et al. | 713/503 |
| 6,806,750 B1 * | 10/2004 | Rasmussen et al. | 327/156 |
| 6,829,318 B2 * | 12/2004 | Kawahara | 375/376 |
| 6,850,584 B2 * | 2/2005 | Kogure et al. | 375/376 |
| 6,856,206 B1 * | 2/2005 | Perrott | 331/25 |
| 6,901,126 B1 * | 5/2005 | Gu | 375/355 |
| 6,937,685 B2 * | 8/2005 | Tang | 375/376 |
| 6,954,506 B2 * | 10/2005 | Cho | 375/321 |
| 6,959,058 B2 * | 10/2005 | Yoo et al. | 375/355 |
| 6,977,975 B1 * | 12/2005 | Reuveni | 375/340 |
| 6,985,552 B1 * | 1/2006 | King | 375/376 |
| 6,996,202 B2 * | 2/2006 | McCormack et al. | 375/355 |
| 7,016,451 B2 * | 3/2006 | Harrison | 375/374 |
| 7,039,149 B2 * | 5/2006 | Tagami | 375/376 |
| 7,050,512 B1 * | 5/2006 | Liang | 375/316 |
| 7,142,621 B2 * | 11/2006 | Vallet et al. | 375/355 |
| 7,151,814 B1 * | 12/2006 | Kong et al. | 375/376 |
| 7,162,002 B2 * | 1/2007 | Chen et al. | 375/376 |
| 7,167,533 B2 * | 1/2007 | Glenn et al. | 375/371 |
| 7,170,964 B2 * | 1/2007 | Kocaman et al. | 375/376 |
| 7,197,102 B2 * | 3/2007 | Rhee et al. | 375/376 |
| 7,200,196 B2 * | 4/2007 | Li et al. | 375/355 |
| 2001/0010670 A1 | 8/2001 | Jinbo et al. | |
| 2001/0036240 A1 * | 11/2001 | Gossmann et al. | 375/376 |
| 2002/0021153 A1 * | 2/2002 | Saeki | 327/163 |
| 2002/0039395 A1 * | 4/2002 | Buchwald et al. | 375/355 |
| 2002/0114418 A1 * | 8/2002 | Nakamura | 375/376 |
| 2002/0131531 A1 * | 9/2002 | Matsumoto et al. | 375/340 |
| 2002/0154721 A1 * | 10/2002 | Harrison | 375/374 |
| 2002/0191723 A1 * | 12/2002 | Fujita et al. | 375/371 |
| 2003/0021369 A1 * | 1/2003 | Lin | 375/355 |
| 2003/0039328 A1 * | 2/2003 | Tomofuji et al. | 375/354 |
| 2003/0091138 A1 * | 5/2003 | Tagami | 375/376 |
| 2003/0112909 A1 * | 6/2003 | Best et al. | 375/355 |
| 2003/0161430 A1 * | 8/2003 | Sou | 375/376 |
| 2003/0179842 A1 * | 9/2003 | Kane et al. | 375/376 |
| 2003/0223525 A1 * | 12/2003 | Momtaz et al. | 375/376 |
| 2003/0227989 A1 * | 12/2003 | Rhee et al. | 375/376 |
| 2003/0227990 A1 * | 12/2003 | Hsu et al. | 375/376 |
| 2004/0017871 A1 * | 1/2004 | Christensen et al. | 375/373 |
| 2004/0042578 A1 * | 3/2004 | Christensen et al. | 375/376 |
| 2004/0109520 A1 * | 6/2004 | Hsu et al. | 375/376 |
| 2004/0146131 A1 * | 7/2004 | Wilson | 375/375 |

FOREIGN PATENT DOCUMENTS

| | | |
|---|---|---|
| JP | 61-114628 A | 6/1986 |
| JP | 61-171320 U | 10/1986 |
| JP | 10-145348 A | 5/1998 |
| JP | 10-327068 A | 12/1998 |
| JP | 2001-210020 A | 8/2001 |

* cited by examiner

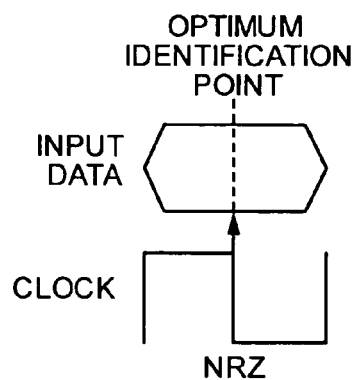
FIG.16A
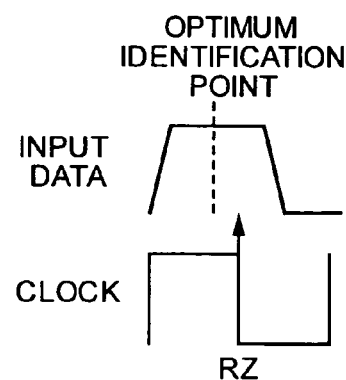
FIG.16B
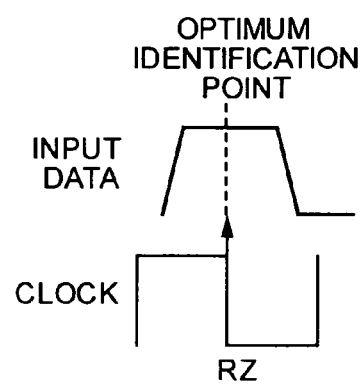
FIG.16C
FIG.17
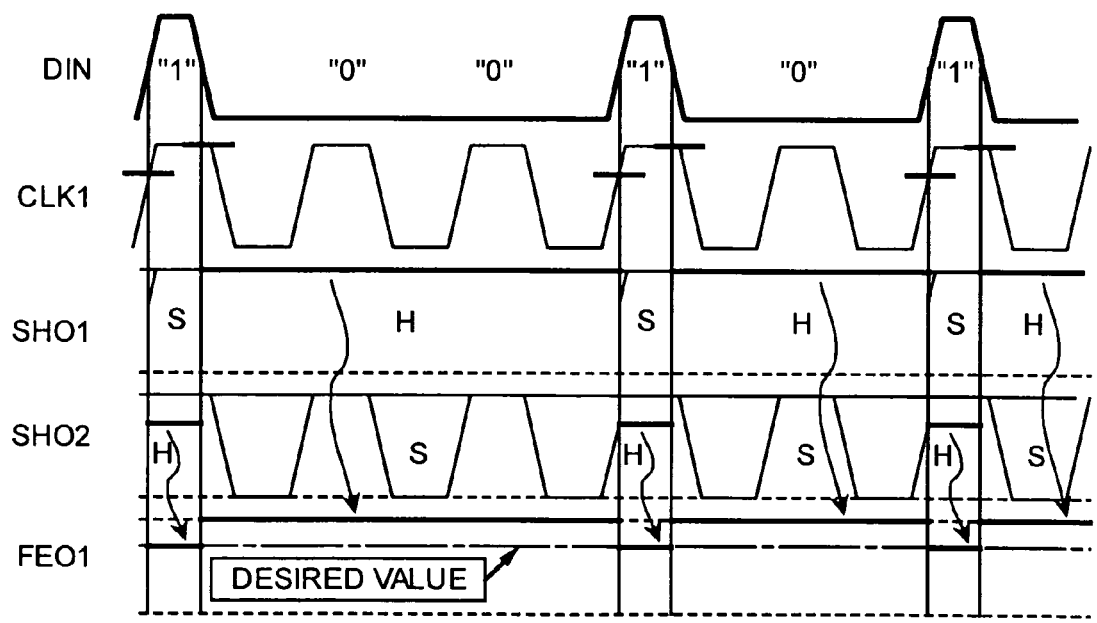

CLOCK DATA RECOVERY CIRCUIT

TECHNICAL FIELD

The present invention relates to a clock data recovery circuit that is used in communication systems or the like. More particularly, the invention relates to a clock data recovery circuit that generates a clock based on return-to-zero (RZ) data and identifies data.

BACKGROUND ART

FIG. 13 is a block diagram of a conventional clock data recovery circuit for non return-to-zero (NRZ) data. The conventional clock data recovery circuit has been described in, for example, "A Si Bipolar Phase and Frequency Detector IC for Clock Extraction up to 8 Gb/s" A. Pottbacker et., al. (IEEE Journal of Solid State Circuits, vol. SC-27, pp1747-1751 (1992)).

The conventional clock data recovery circuit shown in FIG. 13 includes a phase comparator 100, a low pass-filter (hereinafter, "LPF") 200, a voltage control oscillator (hereinafter, "VCO") 300, and a data identifier 400.

The phase comparator 100 compares input data DIN with a clock CLK1 generated by the VCO 300, and detects a difference between the phases of the two. The phase comparator 100 outputs a phase difference signal FEO1 to the LPF 200. The phase difference signal FEO1 corresponds to the detected phase difference in an analog value. The LPF 200 smoothes the phase difference signal FEO1 by removing a higher frequency component from this signal, thereby obtaining a voltage control signal, and outputs this voltage control signal to the VCO 300. The VCO 300 generates the clock CLK1 by adjusting an oscillation frequency based on the voltage control signal, and outputs the generated clock CLK1 to both the phase comparator 100 and the data identifier 400. The data identifier 400 identifies whether the input data DIN is "0" or "1" based on the clock CLK1 generated by the VCO 300.

FIG. 14 is a block diagram of the phase comparator 100 shown in FIG. 13. The phase comparator 100 includes a first sample holding circuit 110, a second sample holding circuit 120, and a selector 130.

The first sample holding circuit 110 samples a voltage of the clock CLK1 during a period when the input data DIN is high ("H"), and holds the voltage of the clock CLK1 at a fall of the input data DIN.

The second sample holding circuit 120 samples a voltage of the clock CLK1 during a period when the input data DIN is low ("L"), and holds the voltage of the clock CLK1 at a rise of the input data DIN.

The selector 130 selects an output SHO2 from the second sample holding circuit 120 when the input data DIN is "H", and selects an output SHO1 from the first sample holding circuit 110 when the input data DIN is "L". The selector 130 outputs the selected signal as the phase difference signal FEO1.

The operation of the conventional clock data recovery circuit is explained next. The operation of the phase comparator 100 is explained first with reference to a timing chart shown in FIG. 15. The timing chart in FIG. 15 indicates that a phase of the clock CLK1 generated by the VCO 300 is lagging behind a phase of the input data DIN. The input data DIN is NRZ data, which is input in the order of "H", "L", "L", "H", "L", and "H", that is, in the order of "1", "0", "0", "1", "0", and "1".

The first sample holding circuit 110 starts sampling the voltage of the clock CLK1 when the input data DIN changes from "L" to "H". The second sample holding circuit 120 holds the voltage of the clock CLK1 at the moment when the input data DIN rises. During the period when the input data DIN is "H", the selector 130 selects the output SHO2 from the second sample holding circuit 120, and outputs the selected output SHO2 from the second sample holding circuit 120 as the phase difference signal FEO1.

When the input data DIN changes from "H" to "L", the first sample holding circuit 110 holds the voltage of the clock CLK1 at the moment when the input data DIN falls. The second sample holding circuit 120 starts sampling the voltage of the clock CLK1. During the period when the input data DIN is "L", the selector 130 selects the output SHO1 from the first sample holding circuit 110, and outputs the selected output SHO1 from the first sample holding circuit 110 as the phase difference signal FEO1.

As explained above, the phase comparator 100 detects a phase difference between the phase of the input data DIN and the phase of the rising clock CLK1, at a change point (i.e., the rise or the fall) of the input data DIN. The phase comparator 100 outputs the detected phase difference information as the phase difference signal FEO1 in an analog value.

The operation of the conventional clock data recovery circuit is explained next. The phase comparator 100 compares the phase of the input data DIN with the phase of the clock CLK 1 generated by the VCO 300, and detects a phase difference between these two signals, as described above. The phase comparator 100 outputs the detected phase difference as the analog phase difference signal FEO1, to the LPF 200.

The LPF 200 smoothes the phase difference signal FEO1 by removing a higher frequency component from this signal, thereby obtaining a voltage control signal, and outputs this voltage control signal to the VCO 300. The VCO 300 generates the clock CLK1 by adjusting the oscillation frequency based on the voltage control signal. In other words, the VCO 300 adjusts the oscillation frequency based on the phase difference between the input data DIN at its change point and the clock CLK1 at its rise time, detected by the phase comparator 100. Based on this adjustment, the VCO 300 matches the phase of the input data DIN with the phase of the clock CLK1 at its rise time. The VCO 300 outputs the generated clock CLK1 to both the phase comparator 100 and the data identifier 400.

The data identifier 400 identifies whether the input data DIN is "1" or "0" at the fall of the clock CLK1. The data identifier 400 outputs the identified data as identification data. Since the same input data DIN signal is input to both the phase comparator 100 and the data identifier 400, the fall phase of the clock CLK1 generated by adjusting the oscillation frequency based on the voltage control signal coincides with the phase at the bit center of the input data DIN that is input to the data identifier 400. Therefore, when the input data DIN is identified at the fall of the clock CLK1, the data identifier 400 can identify the input data DIN at the bit center that is an optimum identification point of the input data DIN, as shown in FIG. 16A.

However, input data handled in the communication system is not limited to NRZ data. Assume that RZ data is input for the input data to the clock data recovery circuit according to the above conventional technique. The operation of the phase comparator 100 when the RZ data is input for the input data DIN is explained with reference to a timing chart shown in FIG. 17.

In the timing chart shown in FIG. 17, it is also assumed that the phase of the clock CLK1 generated by the VCO 300 is lagging behind the phase of the input data DIN and that RZ data "100101" is input for the input data DIN, like in the above example where the NRZ data is used for the input data DIN.

The first sample holding circuit 110 starts sampling the voltage of the clock CLK1 when the input data DIN changes from "L" to "H". The second sample holding circuit 120 holds the voltage of the clock CLK1 at the moment when the input data DIN rises. During a period when the input data DIN is high ("H"), the selector 130 selects the output SHO2 from the second sample holding circuit 120, and outputs the selected output SHO2 from the second sample holding circuit 120 as the phase difference signal FEO1.

When the input data DIN changes from "H" to "L", the first sample holding circuit 110 holds the voltage of the clock CLK1 at the moment when the input data DIN falls. The second sample holding circuit 120 starts sampling the voltage of the clock CLK1. During a period when the input data DIN is high ("L"), the selector 130 selects the output SHO1 from the first sample holding circuit 110, and outputs the selected output SHO1 from the first sample holding circuit 110 as the phase difference signal FEO1.

Since the phase of the clock CLK1 generated by the VCO 300 is lagging behind the phase of the input data DIN, when the input data DIN changes from "H" to "L", the clock CLK1 remains at "H" at the moment when the input data DIN falls, as shown in FIG. 17. Therefore, the output SHO1 from the first sample holding circuit 110 and the output SHO2 from the second sample holding circuit 120 become different values.

When the input data DIN and the clock CLK1 are in a fixed phase relationship, the phase difference signal FEO1 as the output from the phase comparator 100 should also be fixed, in principle.

However, when the RZ data is input to the clock data recovery circuit according to the conventional technique, a disagreement occurs between a desired phase difference signal FEO1 indicated by a dashed line and a phase difference signal FEO1 actually output from the selector 130, as shown in FIG. 17.

When the phase of the clock CLK1 generated by the VCO 300 is lagging behind the phase of the input data DIN, the disagreement of the phase difference signal FEO1 lasts during the period when the input data DIN is "L". In other words, the disagreement period of the phase difference signal FEO1 changes depending on the input data DIN.

As explained above, when the RZ data is input to the conventional clock data recovery circuit, the above disagreement occurs in the phase difference signal that is used to generate a clock for identifying data. Further, this disagreement period depends on input data. Therefore, the phase of the clock for identifying data is distorted, which makes it impossible to accurately identify the input data.

The present invention has been achieved in order to solve the above problems, and it is an object of the present invention to provide a clock data recovery circuit that can stably identify the input data of RZ data.

DISCLOSURE OF THE INVENTION

A clock data recovery circuit according to an aspect of the present invention includes a data identifier that identifies input data based on a clock generated by a voltage control oscillator; a frequency divider that divides a frequency of the input data; a phase comparator that detects a phase difference between a phase of the clock generated by the voltage control oscillator and a phase of the input data of which frequency is divided by the frequency divider, and generates a phase difference signal to eliminate the detected phase difference; and the voltage control oscillator that generates the clock by adjusting an oscillation frequency based on the phase difference signal, and outputs the clock to both the data identifier and the phase comparator.

According to the above aspect, the phase difference is detected by comparing the phase of the frequency-divided input data, that is, the input data of which frequency is divided, with the phase of the generated clock. The detected phase difference is compensated for by adjusting the oscillation frequency based on the phase difference signal. As a result, the clock can be generated of which phase matches the phase of the input data. The input data is identified based on the generated clock.

BRIEF DESCRIPTION OF THE DRAWINGS

FIGS. 16A to 16C depict phase relationships between data and the clock; and

FIG. 17 is a timing chart for explaining an operation of the conventional clock data recovery circuit.

BEST MODE FOR CARRYING OUT THE INVENTION

The present invention will be explained in detail with reference to the accompanying drawings.

Figure 1:
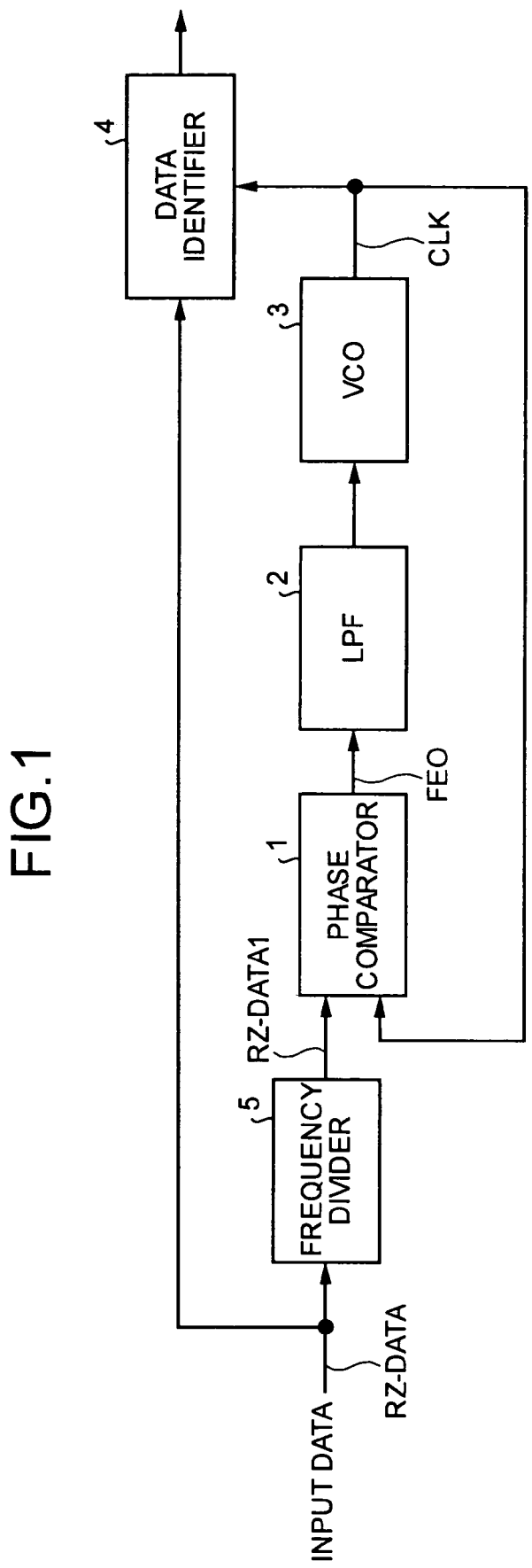
FIG. 1 is a block diagram of a clock data recovery circuit according to a first embodiment of the present invention.

A first embodiment of the present invention will be explained with reference to FIG. 1 to FIG. 3. FIG. 1 is a block diagram of a clock data recovery circuit according to the first embodiment of the present invention. The clock data recovery circuit according to the first embodiment includes a phase comparator 1, a low-pass filter (hereinafter, "LPF") 2, a voltage control oscillator (hereinafter, "VCO") 3, a data identifier 4, and a frequency divider 5.

The frequency divider 5 halves the frequency of input data RZ-DATA by using a T flip-flop, for example, and outputs frequency-divided input data RZ-DATA1 to the phase comparator 1. Specifically, the frequency divider 5 inverts the frequency-divided input data RZ-DATA1 each time when detecting a rise of the input data RZ-DATA, and outputs the inverted data to the phase comparator 1.

The phase comparator 1 compares a phase of the frequency-divided input data RZ-DATA1 with a phase of a clock CLK generated by the VCO 3, and detects a phase difference between these two signals. The phase comparator 1 outputs a phase difference signal FEO, which shows the detected phase difference in an analog value, to the LPF 2. The LPF 2 smoothes the phase difference signal FEO by removing a higher frequency component from this signal, thereby obtaining a voltage control signal, and outputs this voltage control signal to the VCO 3. The VCO 3 generates the clock CLK by adjusting an oscillation frequency based on the voltage control signal, and outputs the generated clock CLK to both the phase comparator 1 and the data identifier 4. The data identifier 4 identifies whether the input data RZ-DATA is "0" or "1" based on the clock CLK generated by the VCO 3.

Figure 2:
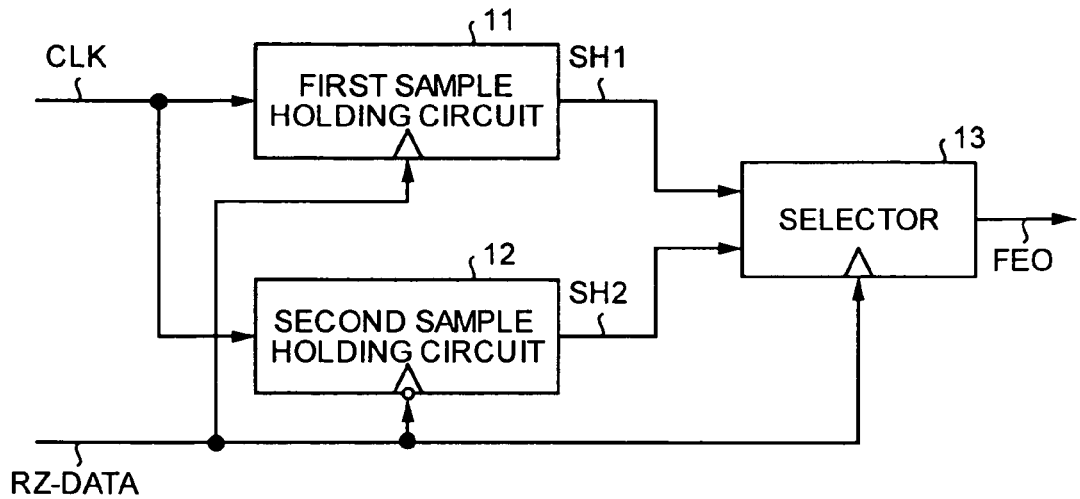
FIG. 2 is a block diagram of a phase comparator shown in FIG. 1.
Figure 3:
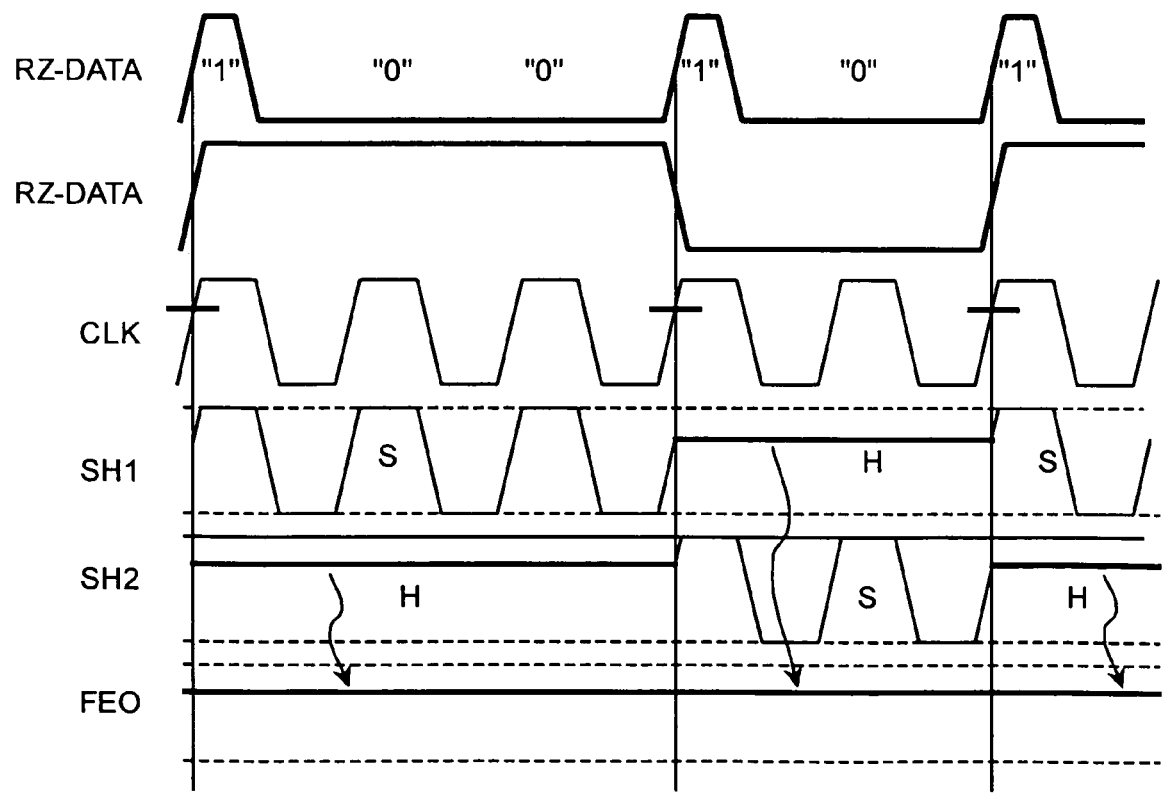
FIG. 3 is a timing chart for explaining an operation of the clock data recovery circuit according to the first embodiment of the invention.

FIG. 2 is a block diagram of the VCO 3 shown in FIG. 1. The phase comparator 1 includes a first sample holding circuit 11, a second sample holding circuit 12, and a selector 13.

The first sample holding circuit 11 samples a voltage of the clock CLK during a period when the frequency-divided input data RZ-DATA1 is "H", and holds the voltage of the clock CLK at a fall of the frequency-divided input data RZ-DATA1.

The second sample holding circuit 12 samples a voltage of the clock CLK during a period when the frequency-divided input data RZ-DATA1 is "L", and holds the voltage of the clock CLK at a rise of the frequency-divided input data RZ-DATA1.

The selector 13 selects an output SH2 from the second sample holding circuit 12 when the frequency-divided input data RZ-DATA1 is "H", and selects an output SH1 from the first sample holding circuit 11 when the frequency-divided input data RZ-DATA1 is "L". The selector 13 outputs the selected signal as the phase difference signal FEO.

The operation of the clock data recovery circuit according to the first embodiment of the present invention is explained next. The operation of the frequency divider 5 and the phase comparator 1 is explained first with reference to a timing chart shown in FIG. 3. The timing chart in FIG. 3 indicates that a phase of the clock CLK generated by the VCO 3 is lagging behind a phase of the input data RZ-DATA. The input data RZ-DATA is in an RZ signal, which is input in the order of "H", "L", "L", "H", "L", and "H", that is, in the order of "1", "0", "0", "1", and "1".

When the input data RZ-DATA changes from "L" to "H", the frequency divider 5 detects a rise of the input data RZ-DATA, and inverts the frequency-divided input data RZ-DATA1. In other words, the frequency divider 5 inverts the frequency-divided input data RZ-DATA1 from "L" to "H", or from "H" to "L", each time when the input data RZ-DATA rises.

The first sample holding circuit 11 starts sampling the voltage of the clock CLK when the frequency-divided input data RZ-DATA1 changes from "L" to "H". The second sample holding circuit 12 holds the voltage of the clock CLK at the moment when the frequency-divided input data RZ-DATA1 rises. During a period when the frequency-divided input data RZ-DATA1 is "H", the selector 13 selects the output SH2 from the second sample holding circuit 12, and outputs the selected output SH2 from the second sample holding circuit 12 as the phase difference signal FEO.

When the frequency-divided input data RZ-DATA1 changes from "H" to "L", the first sample holding circuit 11 holds the voltage of the clock CLK at the moment when the frequency-divided input data RZ-DATA1 falls. The second sample holding circuit 12 starts sampling the voltage of the clock CLK. During a period when the frequency-divided input data RZ-DATA1 is "L", the selector 13 selects the output SH1 from the first sample holding circuit 11, and outputs the selected output SH1 as the phase difference signal FEO.

Thus, each time the input data RZ-DATA becomes "H", the phase comparator 1 switches over between the output SH1 from the first sample holding circuit 11 and the output SH2 from the second sample holding circuit 12, and outputs the phase difference signal FEO. In other words, the phase comparator 1 detects a phase difference between the phase of the input data RZ-DATA at its rise time when "H" is input to the input data RZ-DATA and the phase of the clock CLK at its rise time, and outputs the detected phase difference information as the analog phase difference signal FEO.

The operation of the clock data recovery circuit is explained next. The frequency divider 5 detects a rise of the input data RZ-DATA, and inverts the frequency-divided input data RZ-DATA1. The phase comparator 1 compares the phase of the frequency-divided input data RZ-DATA1 with the phase of the clock CLK generated by the VCO 3, thereby detecting a phase difference between the frequency-divided input data RZ-DATA1 and the clock CLK generated by the VCO 3. The phase comparator 1 outputs the detected phase difference as the analog phase difference signal FEO, to the LPF 2. The LPF 2 smoothes the phase difference signal FEO by removing a higher frequency component from this signal, and outputs the voltage control signal to the VCO 3.

The VCO 3 generates the clock CLK by adjusting the oscillation frequency based on the voltage control signal. In other words, the VCO 3 adjusts the oscillation frequency based on the phase difference between the phase of the input data RZ-DATA at its rise time and the phase of the clock CLK at its rise time, detected by the phase comparator 1, thereby matching the phase of the input data RZ-DATA at its rise time and the phase of the clock CLK at its rise time. The VCO 3 outputs the generated clock CLK to both the phase comparator 1 and the data identifier 4.

The data identifier 4 identifies whether the input data RZ-DATA is "1" or "0" at the fall of the clock CLK. The data identifier 4 outputs the identified data as identification data. The frequency of the frequency-divided input data RZ-DATA1 input to the phase comparator 1 is already divided by the frequency divider 5 in synchronism with the rise of the input data RZ-DATA. Therefore, the data identifier 4 can identify the input data RZ-DATA at the fall of the clock CLK, as shown in FIG. 16B.

As explained above, according to the first embodiment, the phase difference is detected by comparing the phase of the frequency-divided input data, that is, the input data of which frequency is divided, with the phase of the generated clock. The detected phase difference is compensated for by adjusting the oscillation frequency based on the phase difference signal. As a result, the clock can be generated of which phase matches the phase of the input data. The input data is identified based on the generated clock. Therefore, when RZ data is input as the input data, disagreement of the phase difference signal can be suppressed. Consequently, it is possible to identify the input data by using the clock that has no phase distortion dependent on the input data.

A second embodiment of the present invention is explained with reference to FIG. 4 and FIG. 5. According to the first embodiment, the rising edge of the clock generated by the VCO is matched with the change point of the frequency-divided input data. Therefore, the input data is identified using the clock having no phase distortion. However, sometimes, it is not possible to accurately identify input data due to a variation in the duty ratio of the input data, because the fall of the clock for identifying the data is deviated from an optimum identification point of the input data, as shown in FIG. 16B.

As a countermeasure, according to the second embodiment, the phase of the clock generated by the VCO is adjusted, thereby matching the fall of the clock with the optimum identification point of the input data.

Figure 4:
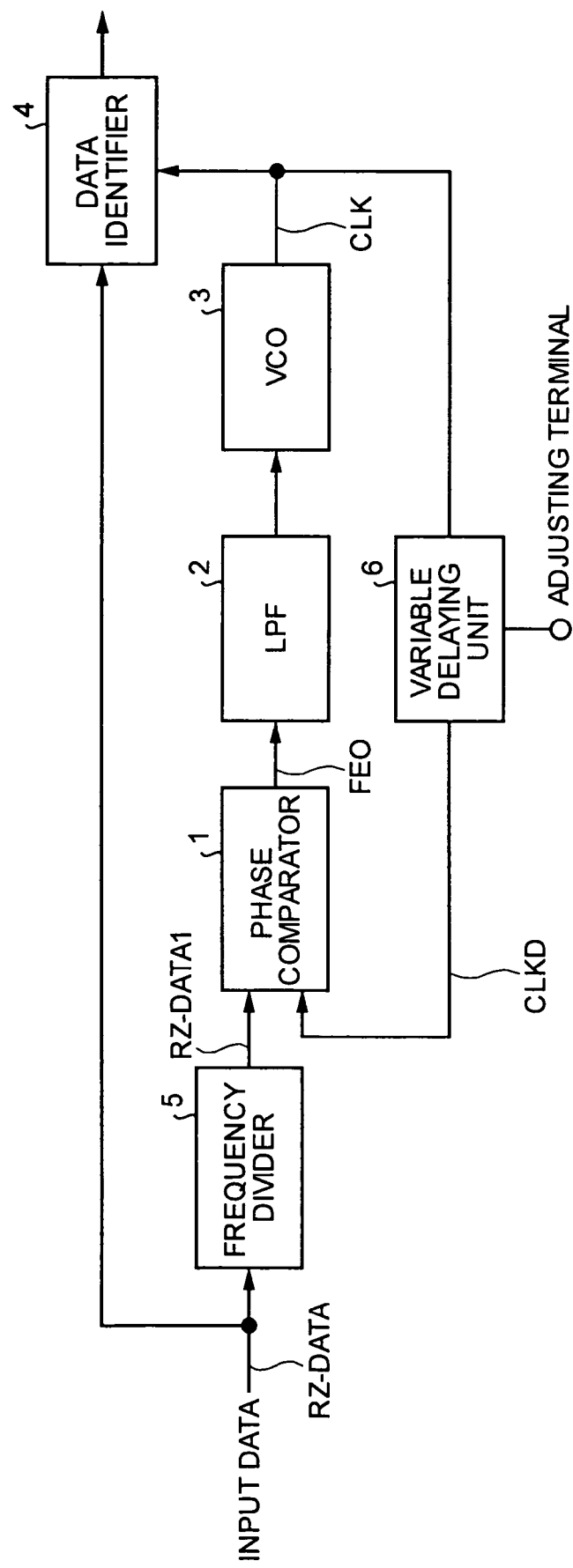
FIG. 4 is a block diagram of a clock data recovery circuit according to a second embodiment of the invention.
Figure 5:
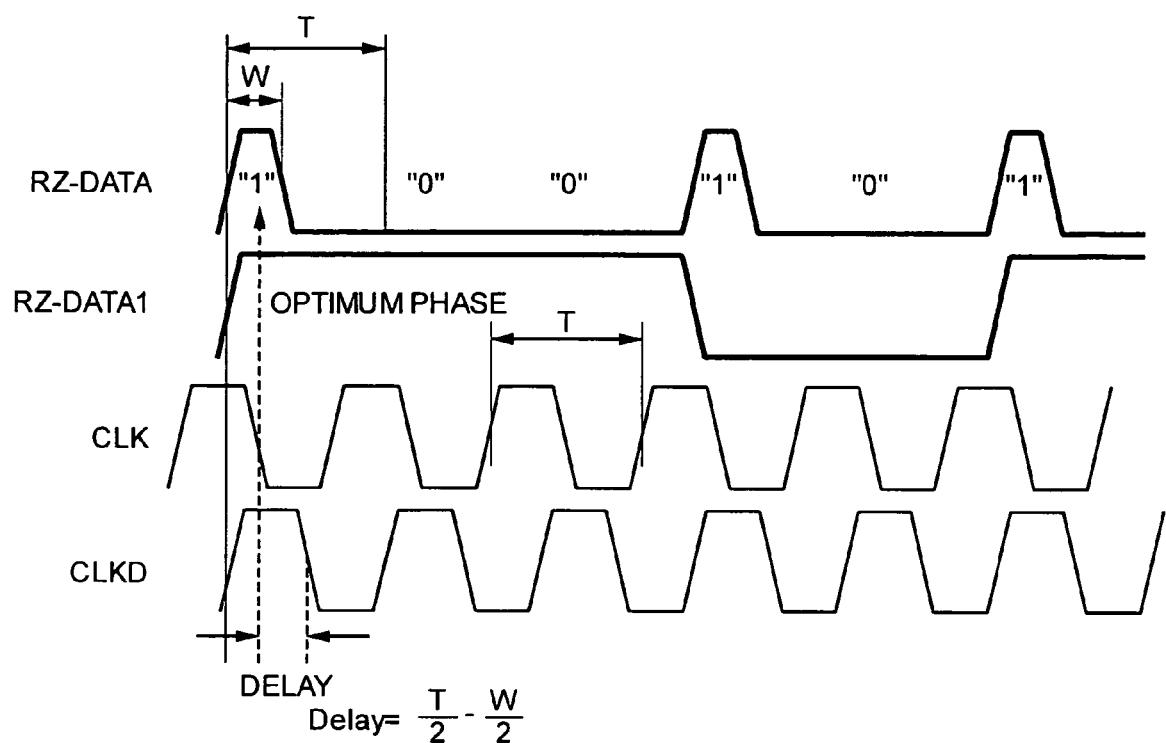
FIG. 5 is a timing chart for explaining an operation of the clock data recovery circuit according to the second embodiment of the invention.

FIG. 4 is a block diagram of the clock data recovery circuit according to the second embodiment of the present invention. In the clock data recovery circuit according to the second embodiment a variable delaying unit 6 added between the VCO 3 and the phase comparator 1 in the clock data recovery circuit according to the first embodiment. Like reference numerals designate like constituent parts having the same functions as those of the clock data recovery circuit according to the first embodiment shown in FIG. 1, and redundant explanation is omitted.

The variable delaying unit 6 delays the clock CLK input from the VCO 3 based on an adjusting signal input from an adjusting terminal, and outputs a delay clock CLKD to the phase comparator 1.

The phase comparator 1 detects a phase difference between the phase of the frequency-divided input data RZ-DATA1, which is synchronous with the rise of the input data RZ-DATA of which frequency is divided by the frequency divider 5, and the phase of the input clock at its rise time. Therefore, in order to adjust the fall of the clock CLK generated by the VCO 3 to an optimum identification point of the input data RZ-DATA (i.e., the center of the bit width of the input data RZ-DATA) as shown in FIG. 16C, the clock to be input to the phase comparator 1 needs to be adjusted.

Assume that the phase of the input data RZ-DATA and the phase of the delay clock CLKD output from the variable delaying unit 6 are in a locked state (that is, the phases coincide with each other). A bit width of the input data RZ-DATA is expressed as W, and a cycle of the clock CLK is expressed as T as shown in FIG. 5. Then, a delay of the delay clock CLKD from the clock CLK, which is necessary to make the fall of the clock CLK coincide with the optimum identification point of the input data RZ-DATA, is expressed as $$delay = T/2 - W/2.$$

Therefore, the variable delaying unit 6 outputs the delay clock CLKD, which is obtained by delaying the clock CLK generated by the VCO 3 by T/2−W/2, to the phase comparator 1. Accordingly, an adjusting signal that is used to delay the CLK generated by the VCO 3 by T/2−W/2 is input to the adjusting terminal of the variable delaying unit 6.

The operation of the clock data recovery circuit according to the second embodiment of the present invention is explained next. The variable delaying unit 6 outputs the delay clock CLKD, which is delayed from the clock CLK generated by the VCO 3 based on the adjusting signal input from the adjusting terminal, to the phase comparator 1. The phase comparator 1 compares the phase of the frequency-divided input data RZ-DATA1, which is synchronous with the rise of the input data RZ-DATA of which frequency is divided by the frequency divider 5, with the phase of the delay clock CLKD, thereby detecting a phase difference between the frequency-divided input data RZ-DATA1 and the clock CLK generated by the VCO 3. The phase comparator 1 outputs the detected phase difference as the analog phase difference signal FEO, to the LPF 2. The LPF 2 smoothes the phase difference signal FEO by removing a higher frequency component from this signal, and outputs the voltage control signal to the VCO 3. The VCO 3 generates the clock CLK by adjusting the oscillation frequency based on the voltage control signal, and outputs the generated clock CLK to both the variable delaying unit 6 and the data identifier 4. The data identifier 4 identifies whether the input data RZ-DATA is "1" or "0" at the fall of the clock CLK. The data identifier 4 outputs the identified data as identification data.

As explained above, according to the second embodiment, the variable delaying unit generates the delay clock which is delayed from the clock generated by the VCO by only the adjusting time input from the outside. The phase comparator compares the phase of the delay clock with the phase of the frequency-divided input data. Therefore, it is possible to match the fall of the clock generated by the VCO with the optimum identification point corresponding to the duty ratio of the input data.

A third embodiment of the present invention is explained with reference to FIG. 6 and FIG. 7. According to the second embodiment, the clock is delayed based on the frequency-divided input data of which phase is compared by the phase comparator. With this arrangement, the fall of the clock generated by the VCO is matched with the optimum identification point of the input data. According to the third embodiment, the frequency-divided input data is delayed based on the clock input to the phase comparator. With this arrangement, the fall of the clock generated by the VCO is matched with the optimum identification point of the input data.

Figure 6:
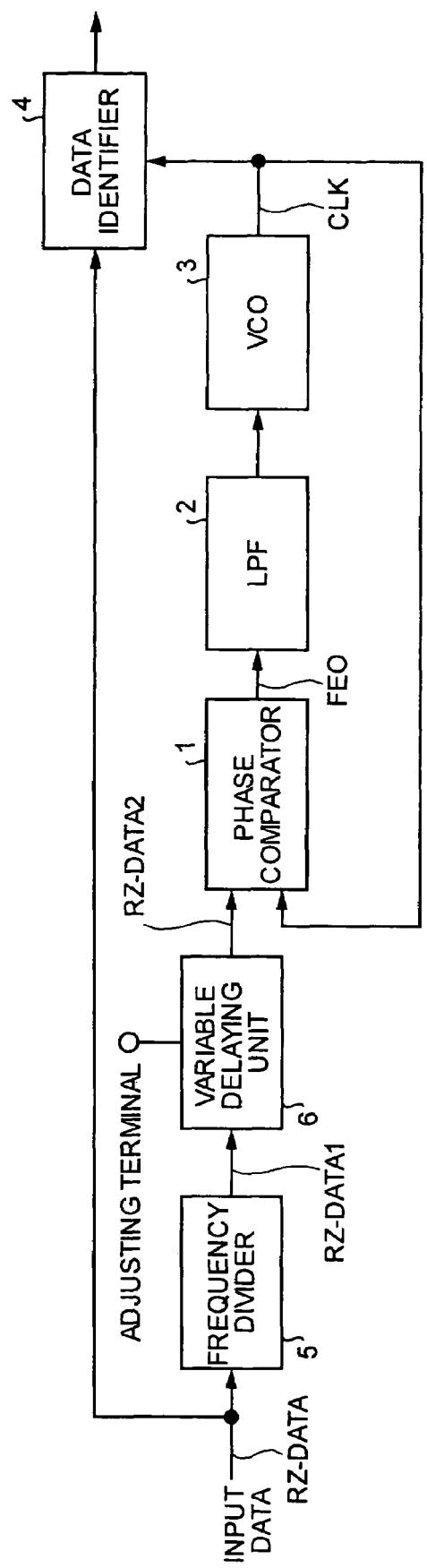
FIG. 6 depicts a configuration of a clock data recovery circuit according to a third embodiment of the invention.
Figure 7:
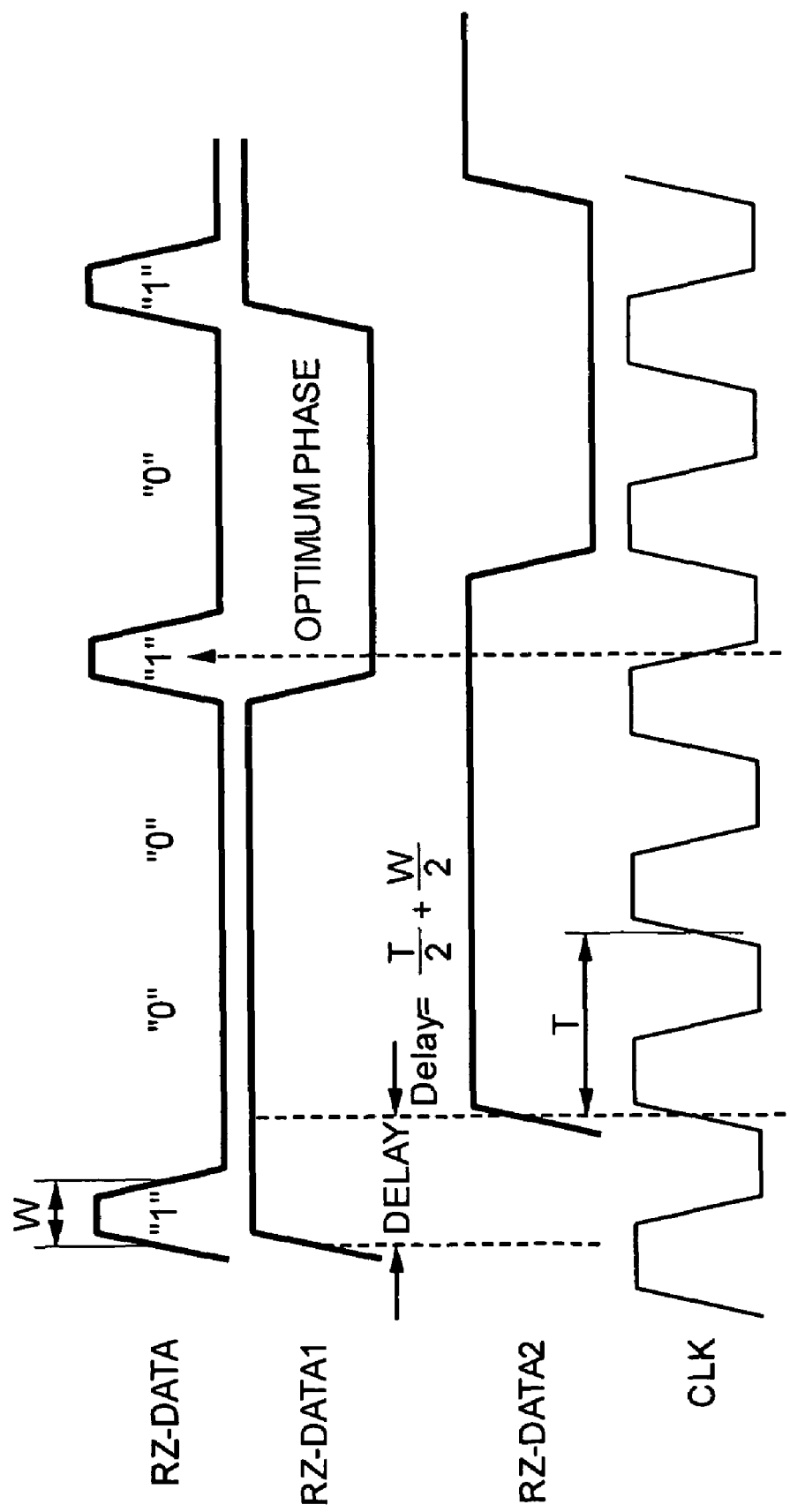
FIG. 7 is a timing chart for explaining an operation of the clock data recovery circuit according to the third embodiment of the invention.

FIG. 6 is a block diagram of the clock data recovery circuit according to the third embodiment of the present invention. The clock data recovery circuit according to the third embodiment has a variable delaying unit 6a added to between the frequency divider 5 and the phase comparator 1 of the clock data recovery circuit according to the first embodiment shown in FIG. 1. Like reference numerals designate like constituent parts having the same functions as those of the clock data recovery circuit according to the first embodiment shown in FIG. 1, and redundant explanation is omitted.

The variable delaying unit 6a delays the frequency-divided input data RZ-DATA1 input from the frequency divider 5 based on an adjusting signal input from an adjusting terminal, and outputs a delayed frequency-divided input data RZ-DATA2 to the phase comparator 1.

Assume that the phase of the clock CLK generated by the VCO 3 and the phase of the delayed frequency-divided input data RZ-DATA2 output from the variable delaying unit 6a are in a locked state. A bit width of the input data RZ-DATA is expressed as W and a cycle of the clock CLK is expressed as T as shown in FIG. 7. Then, a delay of the delayed frequency-divided input data RZ-DATA2 obtained by delaying the frequency-divided input data RZ-DATA1, which is necessary to make the fall of the clock CLK coincide with the optimum identification point of the input data RZ-DATA, is expressed as $$delay = T/2 + W/2.$$

Therefore, the variable delaying unit 6a outputs the delayed frequency-divided input data RZ-DATA2, which is obtained by delaying the frequency-divided input data RZ-DATA1 obtained by the frequency divider 5 by T/2+W/2, to the phase comparator 1. Accordingly, an adjusting signal that is used to delay the frequency-divided input data RZ-DATA1, obtained by frequency division by the frequency divider 5, by T/2+W/2 is input to the adjusting terminal of the variable delaying unit 6a.

The operation of the clock data recovery circuit according to the third embodiment of the present invention is explained next. The frequency divider 5 detects the rise of the input data RZ-DATA, and inverts the frequency-divided input data RZ-DATA1. The variable delaying unit 6a outputs the delayed frequency-divided input data RZ-DATA2, which is obtained by delaying the frequency-divided input data RZ-DATA1 based on the adjusting signal input from the adjusting terminal, to the phase comparator 1. The phase comparator 1 detects a phase difference between the phase of the delayed frequency-divided input data RZ-DATA2 and the phase of the clock CLK generated by the VCO 3 at the change point of the delayed frequency-divided input data RZ-DATA2. The phase comparator 1 outputs the detected phase difference as the analog phase difference signal FEO, to the LPF 2. The LPF 2 smoothes the phase difference signal FEO by removing a higher frequency component from this signal, and outputs the voltage control signal to the VCO 3. The VCO 3 generates the clock CLK by adjusting the oscillation frequency based on the voltage control signal, and outputs the generated clock CLK to the data identifier 4. The data identifier 4 identifies whether the input data RZ-DATA is "1" or "0" at the fall of the clock CLK. The data identifier 4 outputs the identified data as identification data.

As explained above, according to the third embodiment, the variable delaying unit generates the delayed frequency-divided input data by delaying the frequency-divided input data by only the adjusting time input from the outside. The phase comparator compares the phase of the clock generated by the VCO with the phase of the delayed frequency-divided input data. Therefore, it is possible to match the fall of the clock generated by the VCO with the optimum identification point corresponding to the duty ratio of the input data.

A fourth embodiment of the present invention is explained with reference to FIG. 8 and FIG. 9. According to the third and the fourth embodiments, one of the inputs to the phase comparator 1 is delayed based on the other input to this phase comparator. With this arrangement, the fall of the clock for identifying data is matched with the optimum identification point of the input data. According to the fourth embodiment, the input data to be identified is delayed to match the fall of the clock for identifying data with the optimum identification point of the input data.

Figure 8:
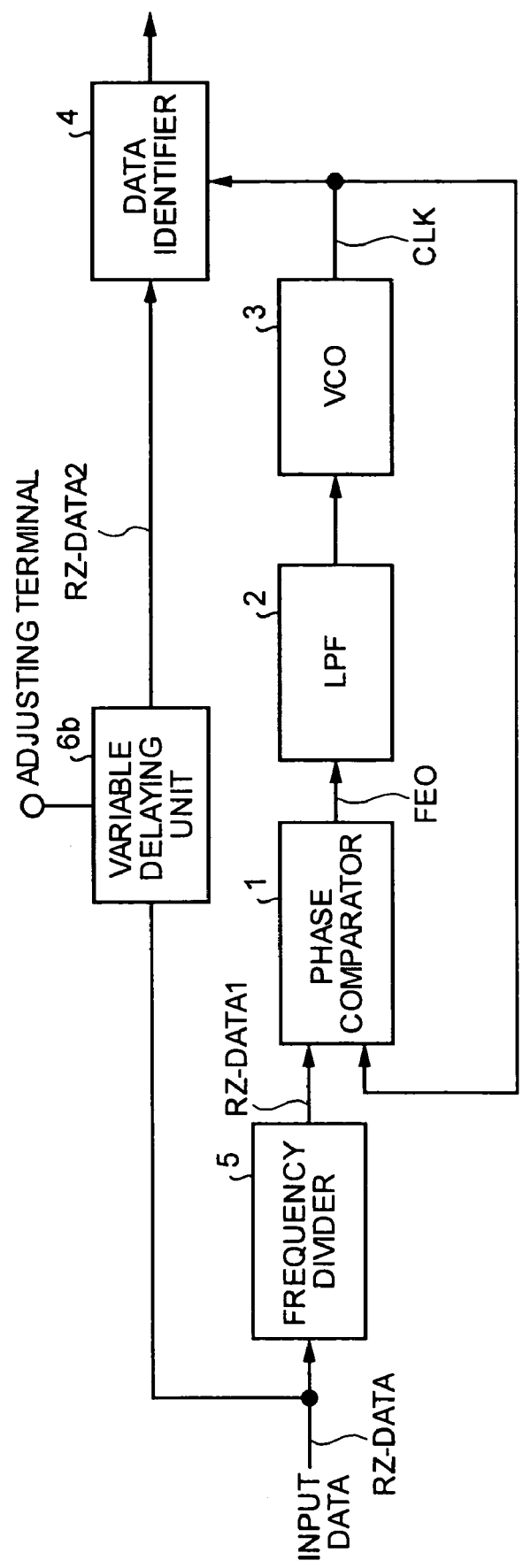
FIG. 8 is a block diagram of a clock data recovery circuit according to a fourth embodiment of the invention.
Figure 9:
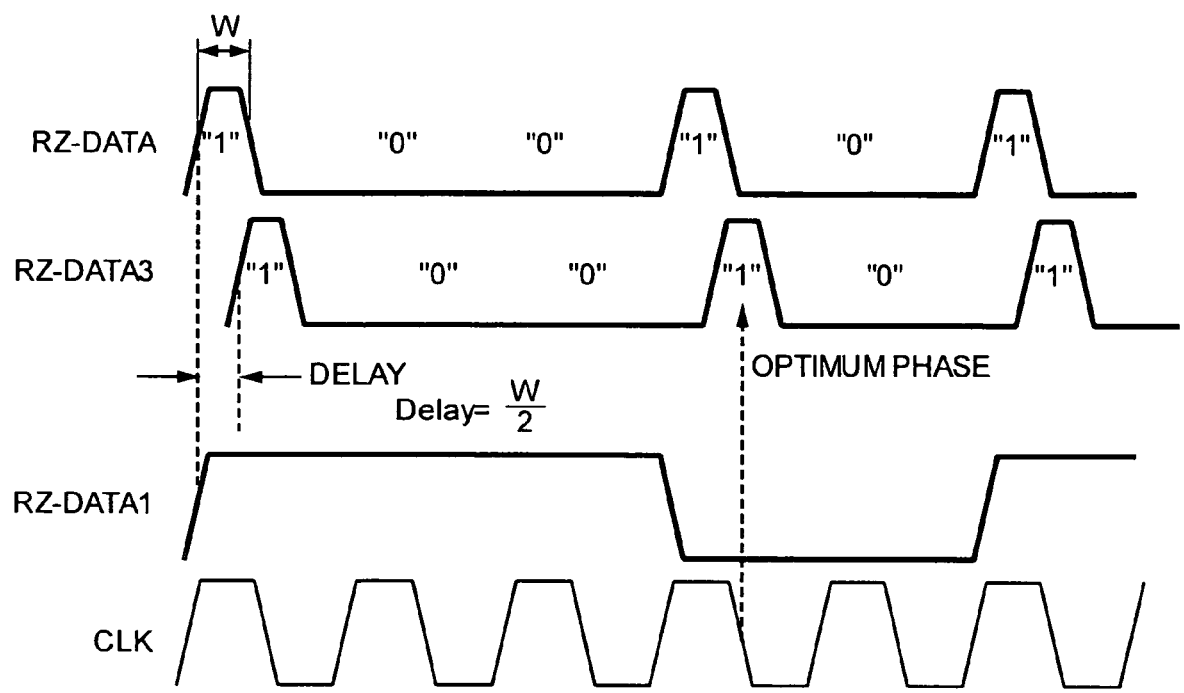
FIG. 9 is a timing chart for explaining an operation of the clock data recovery circuit according to the fourth embodiment of the invention.

FIG. 8 is a block diagram of the clock data recovery circuit according to the fourth embodiment of the present invention. The clock data recovery circuit according to the fourth embodiment has a variable delaying unit 6b added to a front stage of the data identifier 4 of the clock data recovery circuit according to the first embodiment. Like reference numerals designate like constituent parts having the same functions as those of the clock data recovery circuit according to the first embodiment shown in FIG. 1, and redundant explanation is omitted.

The variable delaying unit 6b delays delayed input data RZ-DATA3, which is obtained by delaying the input data RZ-DATA based on the adjusting signal input from the adjusting terminal, to the data identifier 4.

Assume that the phase of the input data RZ-DATA to be input to the phase comparator 1 and the phase of the clock CLK generated by the VCO 3 are in a locked state. A bit width of the input data RZ-DATA is expressed as W, as shown in FIG. 9. Then, a delay of the delayed frequency-divided input data RZ-DATA2 obtained by delaying the frequency-divided input data RZ-DATA1, which is necessary to make the fall of the clock CLK coincide with the optimum identification point of the input data RZ-DATA, is expressed as $$\text{delay}=W/2.$$

Therefore, the variable delaying unit 6b outputs the delayed input data RZ-DATA3, which is obtained by delaying the input data RZ-DATA by TW/2, to the data identifier 4. Accordingly, an adjusting signal that is used to delay the frequency-divided input data RZ-DATA divided by the frequency divider 5, by W/2 is input to the adjusting terminal of the variable delaying unit 6b.

The operation of the clock data recovery circuit according to the fourth embodiment of the present invention is explained next. The frequency divider 5 detects the rise of the input data RZ-DATA, and inverts the frequency-divided input data RZ-DATA1. The phase comparator 1 detects a phase difference between the phase of the frequency-divided input data RZ-DATA1 and the phase of the clock CLK generated by the VCO 3 at the change point of the frequency-divided input data RZ-DATA1. The phase comparator 1 outputs the detected phase difference as the analog phase difference signal FEO, to the LPF 2. The LPF 2 smoothes the phase difference signal FEO by removing a higher frequency component from this signal, and outputs the voltage control signal to the VCO 3. The VCO 3 generates the clock CLK by adjusting the oscillation frequency based on the voltage control signal, and outputs the generated clock CLK to the data identifier 4.

The variable delaying unit 6b outputs the delayed input data RZ-DATA3, which is obtained by delaying the input data RZ-DATA based on the adjusting signal input from the adjusting terminal, to the data identifier 4. The data identifier 4 identifies whether the input data RZ-DATA is "1" or "0" at the fall of the clock CLK. The data identifier 4 outputs the identified data as identification data.

As explained above, according to the fourth embodiment, the variable delaying unit generates the delayed input data by delaying the input data by only the adjusting time input from the outside. The data identifier identifies the delayed input data at the fall of the clock generated by the VCO. Therefore, it is possible to match the fall of the clock generated by the VCO with the optimum identification point corresponding to the duty ratio of the input data.

A fifth embodiment of the present invention is explained with reference to FIG. 10. According to the second embodiment, the delay that the variable delaying unit uses to delay the clock generated by the VCO is input from the outside. According to the fifth embodiment, the delay that is input to the variable delaying unit is generated within the clock data recovery circuit.

Figure 10:
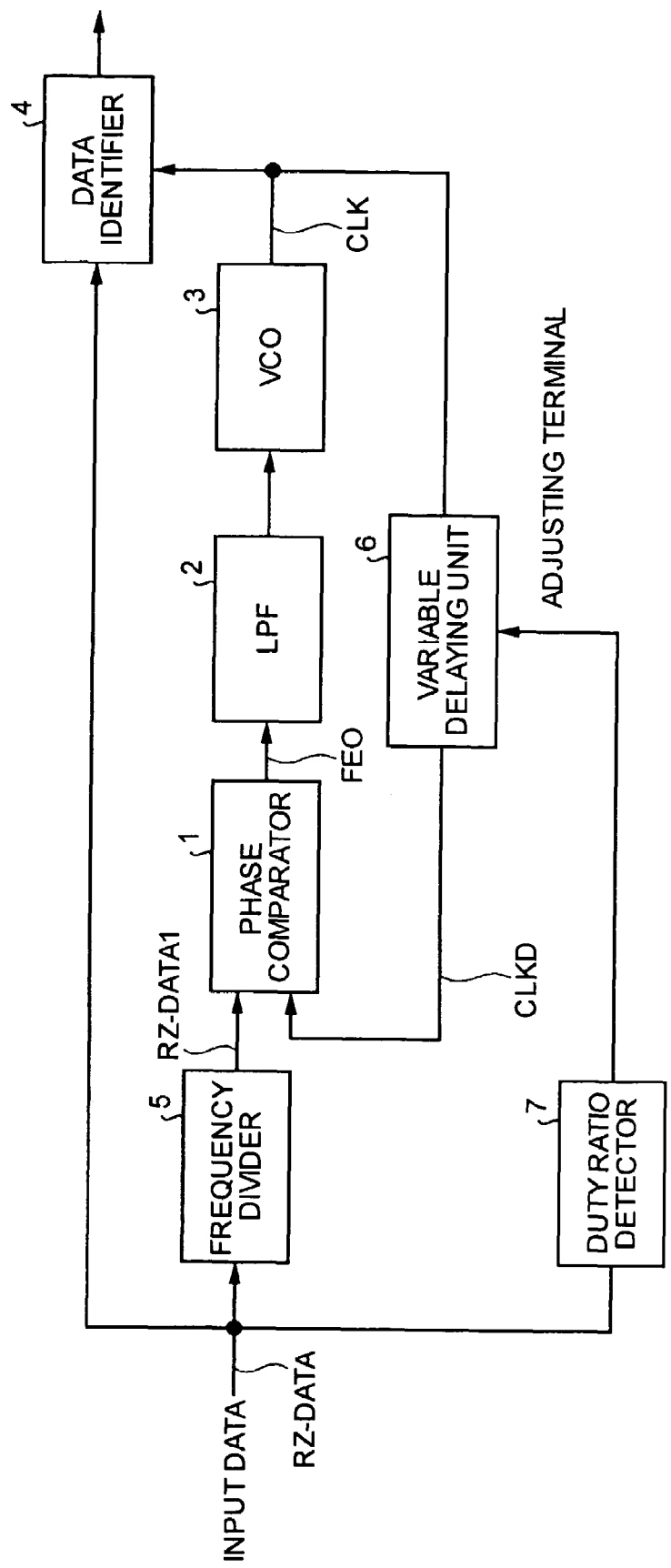
FIG. 10 is a block diagram of a clock data recovery circuit according to a fifth embodiment of the invention.

FIG. 10 is a block diagram of the clock data recovery circuit according to the fifth embodiment of the present invention. The clock data recovery circuit according to the fifth embodiment has a duty ratio detector 7 added to the clock data recovery circuit according to the third embodiment. Like reference numerals designate like constituent parts having the same functions as those of the clock data recovery circuit according to the third embodiment shown in FIG. 4, and redundant explanation is omitted.

The duty ratio detector 7 detects a duty ratio, or a bit width, of the input data RZ-DATA. The duty ratio detector 7 calculates a delay that the variable delaying unit 6 uses to delay the clock CLK, and outputs the calculated delay to the adjusting terminal of the variable delaying unit 6.

As explained in the second embodiment, when W denotes the bit width of the input data RZ-DATA and T denotes the cycle of the clock CLK, the delay to be given to the variable delaying unit 6 is "T/2+W/2". Therefore, the duty ratio detector 7 calculates the delay of T/2+W/2 based on the detected bit width of the input data RZ-DATA and outputs the calculated delay to the variable delaying unit 6.

The operation of the clock data recovery circuit according to the fifth embodiment is the same as that according to the third embodiment, except that the duty ratio detector 7 calculates the adjusting signal that is input from the outside to the variable delaying unit 6. Therefore, the explanation of the operation is omitted.

As explained above, according to the fifth embodiment, the duty ratio detector detects the bit width of the input data, and calculates the delay that is used to match the fall of the clock generated by the VCO with the optimum identification point of the input data. Therefore, the fall of the clock generated by the VCO can be matched with the optimum identification point corresponding to the duty ratio of the input data, without the need for setting the delay at the outside.

The clock data recovery circuit according to the third embodiment shown in FIG. 6 may also include the duty ratio detector, in which case, the duty ratio detector detects the bit width of the input data, calculates the delay to be used to delay the frequency-divided input data by T/2+W/2, and outputs the calculated delay to the adjusting terminal of the variable delaying unit 6a. With this arrangement, the fall of the clock generated by the VCO can be matched with the optimum identification point corresponding to the duty ratio of the input data, without the need for setting the delay at the outside.

The clock data recovery circuit according to the fourth embodiment shown in FIG. 8 can also have the duty ratio detector. In this case, the duty ratio detector detects the bit width of the input data RZ-DATA, calculates the delay to be used to delay the input data RZ-DATA by W/2, and outputs the calculated delay to the adjusting terminal of the variable delaying unit 6b. With this arrangement, the fall of the clock generated by the VCO can be also matched with the optimum identification point corresponding to the duty ratio of the input data, without the need for setting the delay at the outside.

Figure 11:
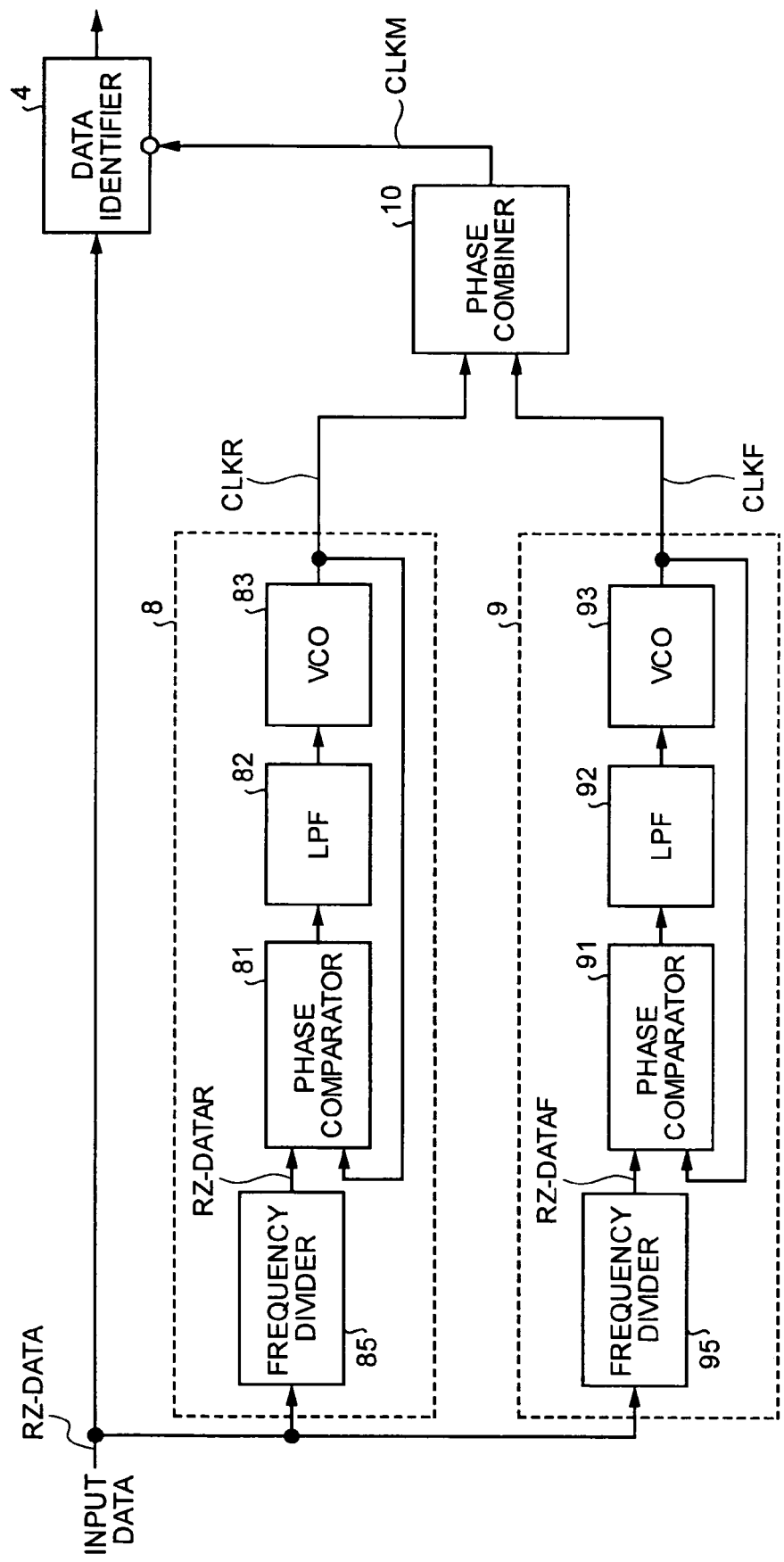
FIG. 11 is a block diagram of a clock data recovery circuit according to a sixth embodiment of the invention.

A sixth embodiment of the present invention is explained with reference to FIG. 11 and FIG. 12. FIG. 11 is a block diagram of the clock data recovery circuit according to the sixth embodiment. The clock data recovery circuit according to the sixth embodiment of the present invention includes a first clock generating circuit 8 that has a frequency divider 85, a phase comparator 81, an LPF 82, and a VCO 83, a second clock generating circuit 9 that has a frequency divider 95, a phase comparator 91, an LPF 92, and a VCO 93, a phase combiner 10, and a data identifier 4.

The first clock generating circuit 8 generates a clock CLKR of which phase coincides with a phase of a rising edge of the input data RZ-DATA.

The frequency divider 85 uses a T flip-flop or the like, inverts frequency-divided input data RZ-DATAR each time when detecting a rise of the input data RZ-DATA, and outputs the inverted data to the phase comparator 81.

The phase comparator 81 compares a phase of the frequency-divided input data RZ-DATAR with a phase of a clock CLKR generated by the VCO 83, and detects a phase difference between these two signals. The phase comparator 81 outputs a phase difference signal FEOR, which shows the detected phase difference in an analog value, to the LPF 82. The configuration of the phase comparator 81 is the same as that of the phase comparator 1 according to the first embodiment shown in FIG. 2, and its explanation is omitted.

The LPF 82 smoothes the phase difference signal FEOR by removing a higher frequency component from this signal, thereby obtaining a voltage control signal, and outputs this voltage control signal to the VCO 83. The VCO 83 generates the clock CLKR by adjusting the oscillation frequency based on the voltage control signal, and outputs the generated clock CLKR to both the phase comparator 81 and the phase combiner 10.

The second clock generating circuit 9 generates a clock CLKF of which phase coincides with a phase of a falling edge of the input data RZ-DATA.

The frequency divider 95 uses a T flip-flop or the like, inverts frequency-divided input data RZ-DATAF each time when detecting a fall of the input data RZ-DATA, and outputs the inverted data to the phase comparator 91.

The phase comparator 91 compares a phase of the frequency-divided input data RZ-DATAF with a phase of a clock CLKF generated by the VCO 93, and detects a phase difference between these two signals. The phase comparator 91 outputs a phase difference signal FEOF, which shows the detected phase difference in an analog value, to the LPF 92. The configuration of the phase comparator 91 is the same as that of the phase comparator 1 according to the first embodiment shown in FIG. 2, and its explanation is omitted.

The LPF 92 smoothes the phase difference signal FEOF by removing a higher frequency component from this signal, thereby obtaining a voltage control signal, and outputs this voltage control signal to the VOG 93. The VCO 93 generates the clock CLKF by adjusting the oscillation frequency based on the voltage control signal, and outputs the generated clock CLKF to both the phase comparator 91 and the phase combiner 10.

The phase combiner 10 combines the clock CLKR generated by the first clock generating circuit 8 with the clock CLKF generated by the second clock generating circuit 9. The phase combiner 10 inverts the combined clock to obtain a clock CLKM, and outputs the clock CLKM to the data identifier 4.

The data identifier 4 identifies whether the input data RZ-DATA is "0" or "1" based on the clock CLKM obtained through the combining by the phase combiner 10.

The operation of the clock data recovery circuit according to the sixth embodiment is explained with reference to a timing chart shown in FIG. 12. The first clock generating circuit 8 generates the clock CLKR of which phase coincides with the phase of the input data RZ-DATA at its rise time, and the second clock generating circuit 9 generates the clock CLKF of which phase coincides with the phase of the input data RZ-DATA at its fall time. These operations are similar to the clock CLK generation operations carried out by the frequency divider 5, the phase comparator 1, the LPF 2, and the VCO 3 in the first embodiment. Therefore, explanations of the clock generations are omitted.

Assume that the first clock generating circuit 8 and the second clock generating circuit 9 are in a locked state. In other words, the rise and the fall of the frequency-divided input data RZ-DATAR that are output from the frequency divider 85 and input to the phase comparator 81 coincide with the rise of the clock CLKR generated by the VCO 81. The rise and the fall of the frequency-divided input data RZ-DATAF that are output from the frequency divider 95 and input to the phase comparator 91 coincide with the rise of the clock CLKF generated by the VCO 91.

Figure 12:
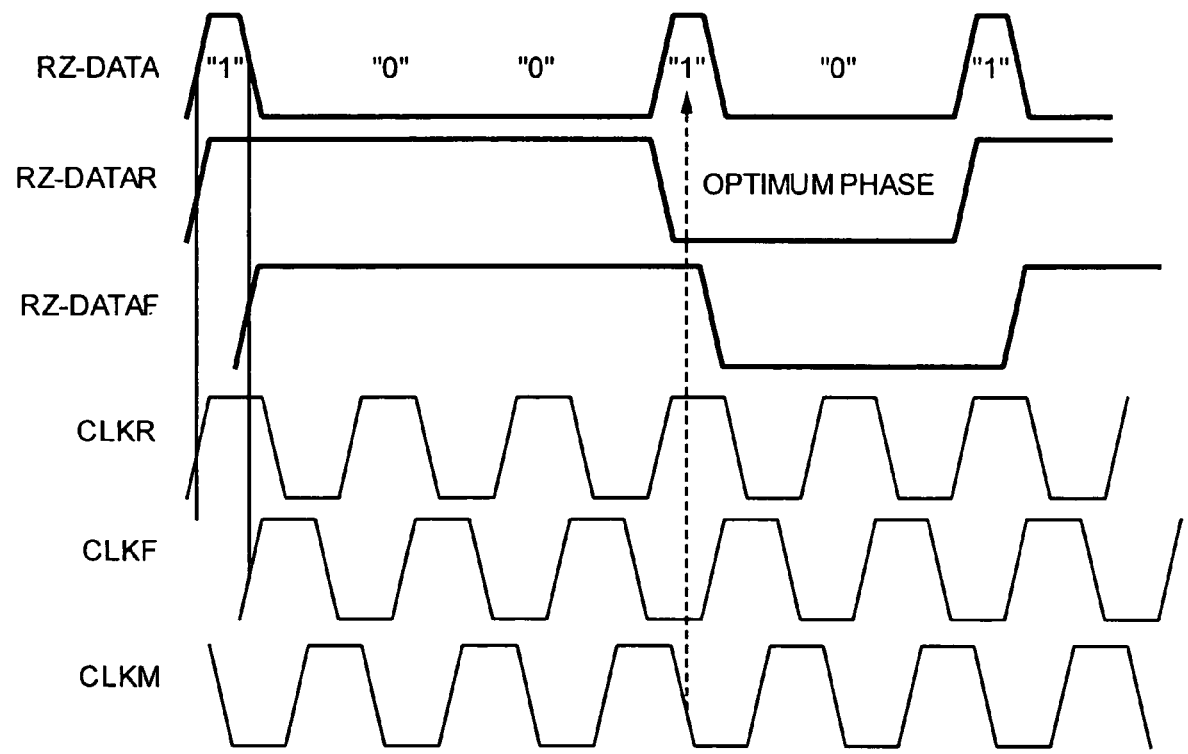
FIG. 12 is a timing chart for explaining an operation of the clock data recovery circuit according to the sixth embodiment of the invention.
Figure 13:
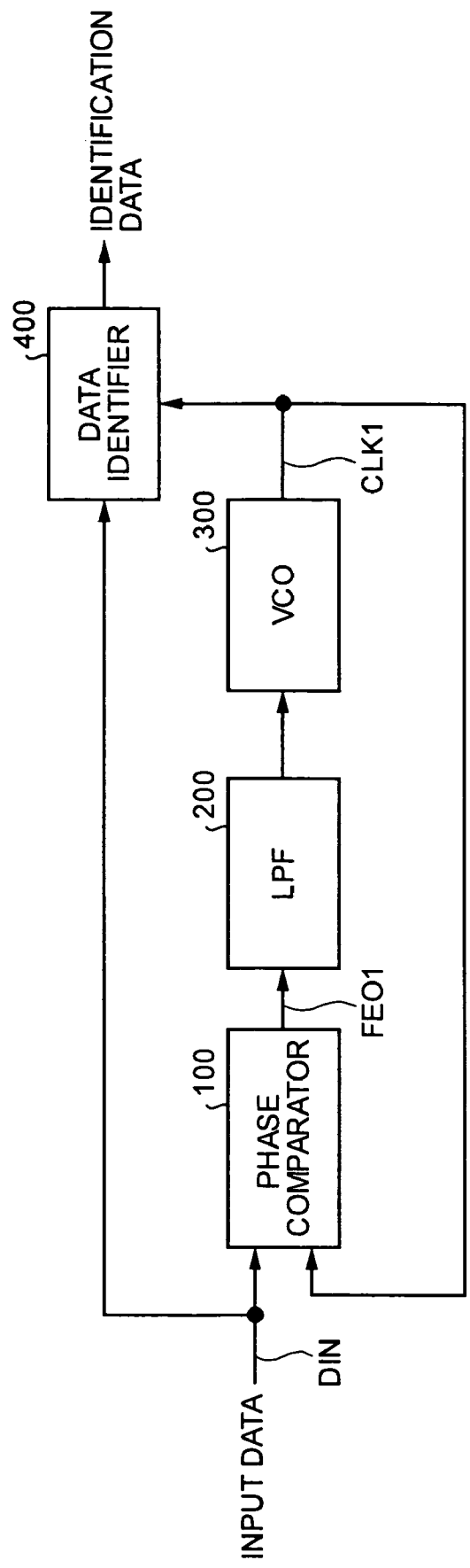
FIG. 13 is a block diagram of a conventional clock data recovery circuit.
Figure 14:
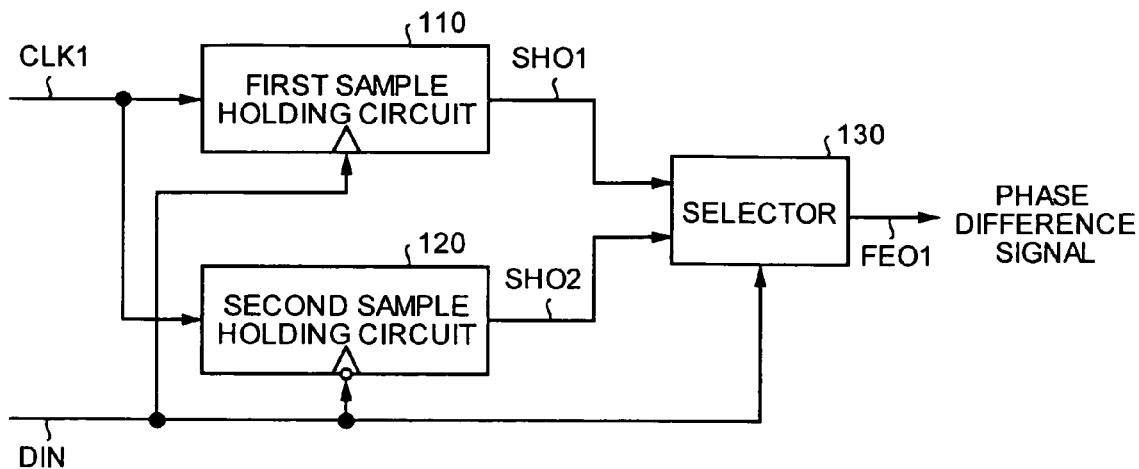
FIG. 14 is a block diagram of a phase comparator shown in FIG. 13.
Figure 15:
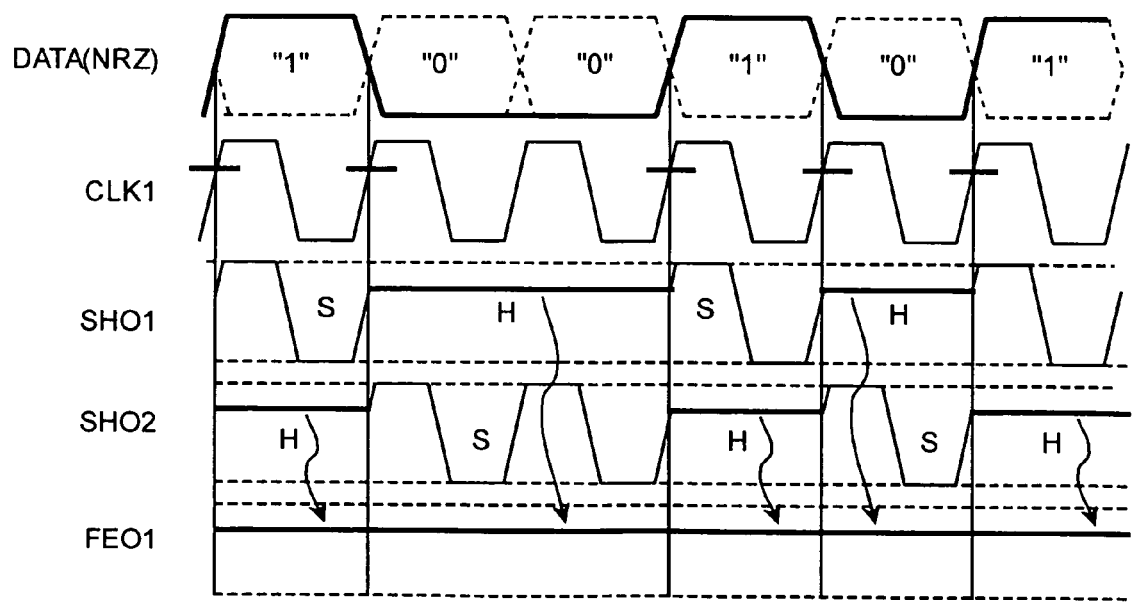
FIG. 15 is a timing chart for explaining an operation of the conventional clock data recovery circuit.

As shown in FIG. 12, the frequency divider 85 of the first clock generating circuit 8 detects the rise of the input data RZ-DATA, and inverts the output frequency-divided input data RZ-DATAR. The frequency divider 95 of the second clock generating circuit 9 detects the fall of the input data RZ-DATA, and inverts the output frequency-divided input data RZ-DATAF. In other words, the frequency-divided input data RZ-DATAF output from the second clock generating circuit 9 is delayed from the frequency-divided input data RZ-DATAR output from the first clock generating circuit 8 by the bit width of the input data RZ-DATA.

Since both the first clock generating circuit 8 and the second clock generating circuit 9 are in the locked state, the clock CLKF generated by the second clock generating circuit 9 is delayed from the clock CLKR generated by the first clock generating circuit by the bit width of the input data RZ-DATA. The phase combiner 10 combines the clock CLKR with the clock CLKF. The phase combiner 10 then outputs the clock CLKM which is obtained by inverting the combined clock, to the data identifier 4. In other words, the phase combiner 10 combines the clock CLKR of which rise coincides with the rise of the input data RZ-DATA, with the clock CLKF of which fall coincides with the fall of the input data RZ-DATA. The phase combiner 10 inverts the combined clock to generate the clock CLKM of which fall coincides with the optimum identification point of the input data RZ-DATA.

The data identifier 4 identifies whether the input data RZ-DATA is "1" or "0" at the fall of the clock CLKM, and outputs the identified data as identification data.

As explained above, according to the sixth embodiment, the first clock generating circuit generates the first clock of which phase coincides with the phase of the frequency-divided input data at its change point that the frequency divider in the first clock generating circuit generates by inverting the input data at its rise time. The second clock generating circuit generates the second clock of which phase coincides with the phase of the frequency-divided input data at its change point that the frequency divider in the second clock generating circuit generates by inverting the input data at its fall time. The phase combiner combines the first clock with the second clock, inverts the combined clock, and generates the clock for identifying the data. Therefore, the input data can be identified always at the optimum identification point corresponding to the duty ratio of the input data.

INDUSTRIAL APPLICABILITY

As explained above, the clock data recovery circuit according to the present invention is useful for a communication system that requires the generation of a clock for identifying input data from the input data. Particularly, the invention is useful for a communication system that uses RZ data for the input data.

The invention claimed is:

1. A clock data recovery circuit comprising:
   a voltage control oscillator that generates a clock;
   a data identifier that identifies input data based on the clock generated by the voltage control oscillator;
   a frequency divider that divides a frequency of the input data;
   a duty ratio detector that determines a duty ratio of the input data;
   a variable delaying unit that generates a delay clock, which is obtained by delaying the clock generated by the voltage control oscillator based on the duty ratio of the input data; and
   a phase comparator that detects a phase difference between a phase of the delay clock generated by the variable delaying unit and a phase of the input data of which frequency is divided by the frequency divider, and generates a phase difference signal to eliminate the detected phase difference,
   wherein the voltage control oscillator generates the clock by adjusting an oscillation frequency based on the phase difference signal, and outputs the clock to both the data identifier and the variable delaying unit.

2. The clock data recovery circuit according to claim 1, wherein a predetermined time to be used to delay the clock generated by the voltage control oscillator to generate the delay clock is set based on the duty ratio of the input data.

* * * * *